US 6,670,719 B2

(12) United States Patent
Eldridge et al.

(10) Patent No.: US 6,670,719 B2
(45) Date of Patent: Dec. 30, 2003

(54) MICROELECTRONIC DEVICE PACKAGE FILLED WITH LIQUID OR PRESSURIZED GAS AND ASSOCIATED METHOD OF MANUFACTURE

(75) Inventors: Jerome M. Eldridge, Los Gatos, CA (US); Paul A. Farrar, South Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/894,528

(22) Filed: Jun. 27, 2001

(65) Prior Publication Data

US 2001/0034117 A1 Oct. 25, 2001

Related U.S. Application Data

(63) Continuation-in-part of application No. 09/640,149, filed on Aug. 16, 2000, which is a continuation-in-part of application No. 09/382,929, filed on Aug. 25, 1999.

(51) Int. Cl.[7] ............................. H05K 7/20; H01L 23/28
(52) U.S. Cl. ....................... 257/790; 257/778; 257/779; 257/780; 257/787; 257/789
(58) Field of Search ................................. 257/680, 778, 257/682, 704, 737, 738, 779, 780, 790, 690, 787, 789

(56) References Cited

U.S. PATENT DOCUMENTS

| | | |
|---|---|---|
| 2,244,608 A | 6/1941 | Cooper |
| 3,147,110 A | 9/1964 | Foerster |
| 3,337,334 A | 8/1967 | Fenn et al. |
| 3,506,438 A | 4/1970 | Krock et al. |
| 3,548,915 A | 12/1970 | Richmond et al. |
| 3,548,948 A | 12/1970 | Richmond et al. |
| 3,687,737 A | 8/1972 | Krock et al. |
| 4,389,429 A | 6/1983 | Soclof |
| 4,561,173 A | 12/1985 | Te Velde |
| 4,962,058 A | 10/1990 | Cronin et al. |
| 5,158,986 A | 10/1992 | Cha et al. |
| 5,173,442 A | 12/1992 | Carey |

(List continued on next page.)

FOREIGN PATENT DOCUMENTS

| | | |
|---|---|---|
| EP | 0 578 856 A1 | 1/1994 |
| GB | 2 158 995 A | 11/1985 |

OTHER PUBLICATIONS

U.S. patent application Ser. No. 09/927,302, Eldridge et al., filed Aug. 10, 2001.
U.S. patent application Ser. No. 09/894,528, Eldridge et al., filed Jun. 27, 2001.
U.S. patent application Ser. No. 09/640,149, Eldridge et al., filed Aug. 16, 2000.

(List continued on next page.)

*Primary Examiner*—David Nelms
*Assistant Examiner*—Reneé R. Berry
(74) *Attorney, Agent, or Firm*—Perkins Coie LLP

(57) ABSTRACT

A microelectronic device package and method for manufacture. In one embodiment, the device package can include a microelectronic substrate having first and second device features, a conductive link that includes a conductive material extending between the first and second device features, and an external cover or enclosure disposed around at least a portion of the substrate and the conductive link. The package can be filled with a liquid or a pressurized gas to transfer heat away from the conductive link. In one embodiment, the enclosure can have a composition substantially identical to the composition of the conductive links and the enclosure can be formed simultaneously with formation of the conductive link to reduce the number of process steps required to form the microelectronic device package. A sacrificial material can temporarily support the conductive link during manufacture and can subsequently be removed to suspend at least a portion of the conductive link between two points.

40 Claims, 9 Drawing Sheets

U.S. PATENT DOCUMENTS

| | | | |
|---|---|---|---|
| 5,324,683 A | 6/1994 | Fitch et al. | |
| 5,324,684 A | 6/1994 | Kermani et al. | |
| 5,334,356 A | 8/1994 | Baldwin et al. | |
| 5,336,914 A | 8/1994 | Andoh | |
| 5,408,742 A | 4/1995 | Zaidel et al. | |
| 5,444,105 A | 8/1995 | Ornstein | |
| 5,447,264 A | 9/1995 | Koopman et al. | |
| 5,457,334 A | 10/1995 | Nishimoto | |
| 5,470,802 A | 11/1995 | Gnade et al. | |
| 5,473,814 A | 12/1995 | White | |
| 5,510,645 A | 4/1996 | Fitch et al. | |
| 5,578,146 A | 11/1996 | Grant et al. | |
| 5,593,926 A | 1/1997 | Fujihira | |
| 5,725,689 A | 3/1998 | Nishida et al. | |
| 5,747,880 A | 5/1998 | Havemann et al. | |
| 5,786,630 A | 7/1998 | Bhansali et al. | |
| 5,798,559 A | 8/1998 | Bothra et al. | |
| 5,821,621 A | 10/1998 | Jeng | |
| 5,844,317 A | 12/1998 | Bertolet et al. | |
| 5,866,953 A | 2/1999 | Akram et al. | |
| 5,879,787 A | 3/1999 | Petefish | |
| 5,891,797 A | 4/1999 | Farrar | |
| 5,900,668 A | 5/1999 | Wollesen | |
| 5,972,737 A | 10/1999 | Polese et al. | |
| 5,983,492 A | 11/1999 | Fjelstad | |
| 5,989,941 A | 11/1999 | Wensel | |
| 6,046,496 A | 4/2000 | Corisis et al. | |
| 6,048,744 A | 4/2000 | Corisis et al. | |
| 6,049,125 A | 4/2000 | Brooks et al. | |
| 6,075,288 A | 6/2000 | Akram | |
| 6,077,792 A | 6/2000 | Farrar | |
| 6,078,088 A | 6/2000 | Buynoski | |
| 6,122,171 A | 9/2000 | Akram et al. | |
| 6,148,509 A | 11/2000 | Schoenfeld et al. | |
| 6,153,924 A | 11/2000 | Kinsman | |
| 6,159,764 A | 12/2000 | Kinsman et al. | |
| 6,163,956 A | 12/2000 | Corisis | |
| 6,204,091 B1 | 3/2001 | Smith et al. | |
| 6,208,519 B1 | 3/2001 | Jiang et al. | |
| 6,211,561 B1 | 4/2001 | Zhao | |
| 6,215,175 B1 | 4/2001 | Kinsman | |
| 6,229,100 B1 | 5/2001 | Fjelstad | |
| 6,252,772 B1 | 6/2001 | Allen | |
| 6,268,262 B1 | 7/2001 | Loboda | |
| 6,303,981 B1 | 10/2001 | Moden | |
| 6,314,639 B1 | 11/2001 | Corisis | |
| 6,324,754 B1 * | 12/2001 | DiStefano et al. | 29/840 |
| 6,326,242 B1 | 12/2001 | Brooks et al. | |
| 6,326,687 B1 | 12/2001 | Corisis | |
| 6,344,976 B1 | 2/2002 | Schoenfeld et al. | |
| 6,384,473 B1 * | 5/2002 | Peterson et al. | 257/680 |
| 6,429,522 B2 | 8/2002 | Petrarca et al. | |
| 6,495,445 B2 | 12/2002 | Clevenger et al. | |

OTHER PUBLICATIONS

U.S. patent application Ser. No. 09/384,157, Forbes et al., filed May 31, 2000.

U.S. patent application Ser. No. 09/382,929, Paul A. Farrar, filed Apr. 25, 1999.

Volksen, W., et al., "Characterization and Processing Considerations for Methylsilsequioxane Based Dielectrics", *Proceedings of the Fifth Dielectric for ULSI Multilevel Interconnections*, Santa Clara, CA, pp. 83–90, (1999).

Singer, Peter, "The New Low–K Candidate: It's a Gas," *Semiconductor International*, 22(3): p. 38, (Mar. 1999).

Shibasaki, T., et al., "Process and Application of Fumed Silica AEROSIL ", $3^{rd}$ *Annual Workshop on Mechanical Polishing*, Lake Placid, New York, pp. 1–26, (1998).

Chiniwalla, P., et al., "Structure–Property Relations for Polynorbornenes", *Proceedings from the Eighth Meeting of the Dupont Symposium on Polymides in Microelectronics*, pp. 615–642, (1998).

Vardaman, E. Jan; Future Packaging Trends: CSP vs. Flip Chip; Proceeding of the $11^{th}$ European Microelectronic Conference; 1997, p. 295–299.

Jin, C., et al., "Porous Xerogel Films as Ultra–Low Permittivity Dielectrics for ULSI Interconnect Applications", *Conference Proceedings ULSI XII—1997 Materials Research Society*, pp. 463–469, (1997).

Ramos, T., et al., "Nanoporous Silica for Dielectric Constant Less Than 2", *Conference Proceedings ULSI XII—1997 Materials Research Society*, 455–461, (1997).

Jayaraj, K., et al., "Low–Dielectric Constants Microcellular Foams", *Proceedings from the Seventh Meeting of the Dupont Symposium on Polymides in Microelectronics*, pp. 474–501, (Sep. 1996).

Miller, R. D., et al., "Low Dielectric Constant Polyimides and Polyimide Nanofoams", *Proceedings from the Seventh Meeting of the Dupont Symposium on Polymides in Microelectronics*, pp. 443–473, (Sep. 1996).

Ting, C. H., "Low K Material/Process Development", *1996 VLSI Multilevel Interconnection State–of–the–Art Seminar*, pp. 171–212, (Jun. 1996).

"Packaging", *Electronic Materials Handbook, vol. 1*, ASM International, pp. 105, 768–769, (1989).

Blodgett and Barbour, "Thermal Conduction Module: A High–Performance Multilayer Ceramic Package," *IBM Journal of Research and Development*, vol. 26, No. 1, pp. 30–36 (1/82).

"Properties and Selection: Nonferous Alloys and Pure Metals", *Metals Handbook Ninth Edition, vol. 2*, ASM International, pp. 157, 395, (1979).

Van Vlack, L. H., *Elements of Materials Science*, Addison–Wesley Publishing Co., Inc. Reading, MA, p. 468, (1959).

\* cited by examiner

MICROELECTRONIC DEVICE PACKAGE FILLED WITH LIQUID OR PRESSURIZED GAS AND ASSOCIATED METHOD OF MANUFACTURE

CROSS-REFERENCE TO RELATED APPLICATIONS

The present application is a continuation-in-part of U.S. application Ser. No. 09/640,149, filed Aug. 16, 2000 and U.S. application Ser. No. 09/382,929, filed Aug. 25, 1999, both incorporated herein in their entireties by reference.

TECHNICAL FIELD

This invention relates to microelectronic device packages filled with liquid or pressurized gas, and methods for manufacturing and processing such packages.

BACKGROUND OF THE INVENTION

Packaged microelectronic assemblies, such as memory chips and microprocessor chips, typically include a microelectronic substrate die encased in a plastic, ceramic, or metal protective covering. The die includes functional devices or features, such as memory cells, processor circuits, and interconnecting wiring. The die also typically includes bond pads electrically coupled to the functional devices. The bond pads can be coupled to pins or other types of terminals that extend outside the protective covering for connecting to busses, circuits and/or other microelectronic assemblies.

As the size of microelectronic device packages decreases to allow the packages to fit into more compact electronic products (such as mobile phones and laptop computers), the distances between adjacent functional devices and between adjacent interconnecting wires decreases. As these distances decrease, the likelihood for capacitive coupling between adjacent structures increases, which can impair or reduce the maximum performance of the packaged microelectronic device.

One approach to decreasing the capacitance between neighboring wires within the die is to reduce the dielectric constant of the solid material between the wires. For example, polyimides (having a dielectric constant of 3.5) have been used to replace silicon dioxide (having a dielectric constant of 4). A more substantial reduction in the dielectric constant is obtained by replacing the solid insulating material typically positioned between layers of the wiring with a gas, such as air. For example, U.S. Pat. No. 5,891,797 to Farrar and U.S. Pat. No. 5,324,683 to Fitch et al. disclose a process for building successive layers of wiring on a semiconductor substrate by temporarily supporting the wires with sacrificial filler material, and then removing the filler material from around the wires by etching or a plasma process to form suspended "air bridges" that conduct electrical signals from one part of the device package to another. The wires can be formed in the filler material using a dual damascene process, such as is disclosed in U.S. Pat. No. 4,962,058 to Cronin et al. The support material can include a resist material, as disclosed in U.S. Pat. No. 5,593,926 to Fujihiri, that can be removed by etching processes (such as the processes disclosed in U.S. Pat. No. 4,561,173 to Te Velde) or evaporative processes (such as the processes disclosed in U.S. Pat. No. 5,408,742 to Zaidel et al.). U.S. Pat. Nos. 5,891,797; 5,324,683; 4,962,058; 5,593,926; 4,561,173; and 5,408,742 are herein incorporated in their entirety by reference.

It can be shown that the maximum unsupported link of an air bridge in an integrated circuit is governed by the following equation:

$$L = \sqrt[4]{32E\delta h^2/5p} \text{ or } \approx 1.6(E\delta/p)^{1/4}h^{1/2}$$

where L=the unsupported bridge length
E=the modular elasticity of the bridge material
δ=the maximum allowable deflection of the bridge
ρ=the density of the bridge material
h=the vertical thickness of the bridge As microelectronic devices become smaller, the thicknesses of the bridges and the distances between adjacent bridges also become smaller. To prevent the bridges from sagging into each other, the maximum unsupported length of each bridge decreases. For example, if the bridge is made of an aluminum copper silicon alloy (which has a module of elasticity of 71 GPa and a density of 2.79 Mg/m$^3$), has a maximum allowable deflection of 5,000 angstroms (including a safety factor), and a thickness of 10,000 angstroms, the maximum unsupported bridge length is approximately 1.6 millimeters. If the maximum allowable deflection is decreased to 2,500 angstroms, and the bridge thickness is reduced to 5,000 angstroms, the maximum unsupported bridge length is approximately 1 millimeter. If the maximum allowable deflection is further decreased to 1,500 angstroms, the maximum allowable unsupported length is approximately 0.6 millimeters. Because current chips typically measure over 1 centimeter along an edge, it becomes increasingly difficult to reduce the thickness of the bridges and the spacing between bridges without supporting the bridges at such frequent intervals that the benefits of unsupported bridge segments (e.g., the reduced dielectric constant of the material adjacent to the bridge) are lost.

Furthermore, as the bridge thickness (and therefore the cross-section of the conductive line forming the bridge) decreases, the resistivity of the wire forming the bridge increases. One approach to addressing this drawback is to reduce the bulk resistivity of the wire, for example, by replacing aluminum alloy wires with copper wires. However, copper has a significantly greater density than aluminum and aluminum alloys, and therefore has only 85% of the unsupported bridge length of an aluminum or aluminum alloy conductor.

Another problem with conventional air bridge designs is that the air adjacent to the wires typically has a lower thermal conductivity than the solid material it replaced. Accordingly, it can be more difficult to transfer heat from the packaged microelectronic device. As a result, the microelectronic device may be more likely to overheat, which can reduce the life expectancy and/or performance level of the device.

SUMMARY

The present invention is directed toward microelectronic device packages and methods for forming such packages. A package in accordance with one aspect of the invention includes a microelectronic substrate having at least one microelectronic device feature. The package can further include a conductive link that includes a conductive material and is coupled to the at least one microelectronic device feature. An enclosure is sealably disposed around at least a portion of the microelectronic substrate and the conductive link, with the enclosure being configured to contain a gas in contact with the conductive link at a pressure at least one atmosphere greater than a pressure external to the enclosure.

In one aspect of the invention, the package can include helium and/or hydrogen at a pressure of from about five atmospheres to about 50 atmospheres above atmospheric pressure. The conductive link can include a wirebond or solder ball coupled between the microelectronic substrate and a substrate support. In another aspect of the invention, the conductive link can be coupled between two microelectronic device features and at least a portion of the conductive link can be suspended between first and second points between the two microelectronic device features.

The invention is also directed toward a method for manufacturing a microelectronic device package. In one aspect of the invention, the method can include forming at least one microelectronic device feature at least proximate to a surface of a microelectronic substrate, coupling a conductive link to the at least one microelectronic device feature, and disposing an enclosure around at least a portion of the microelectronic substrate. The method can further include sealing a gas within the enclosure, with the gas being in contact with the conductive link and at a pressure of at least one atmosphere above atmospheric pressure. The method can further include exposing the enclosure to atmospheric pressure while the gas remains sealed within the enclosure.

In a further aspect of the invention, the method can include placing the microelectronic substrate, the enclosure and the conductive link in a controlled pressure environment and reducing a pressure within the controlled pressure environment to withdraw gas from the enclosure while the enclosure remains open to the controlled pressure environment. The method can further include elevating the pressure within the controlled pressure environment to be at least one atmosphere greater than atmospheric pressure while the enclosure remains open to the controlled pressure environment. The method can still further include sealing the enclosure while the enclosure remains in the controlled pressure environment and removing the enclosure, the microelectronic substrate, and the conductive link as a unit from the controlled pressure environment.

DETAILED DESCRIPTION

The present disclosure describes packaged microelectronic devices and methods for manufacturing such devices. The packages can have a microelectronic substrate positioned in a sealed enclosure. Conductive links within the enclosure can be in contact with a liquid or a pressurized gas to transfer heat from the conductive links to the surfaces of the enclosure. Many specific details of certain embodiments of the invention are set forth in the following description and in FIGS. 1A–10 to provide a thorough understanding of these embodiments. One skilled in the art, however, will understand that the present invention may have additional embodiments, and the invention may be practiced without several of the details described below.

Figure 1A:
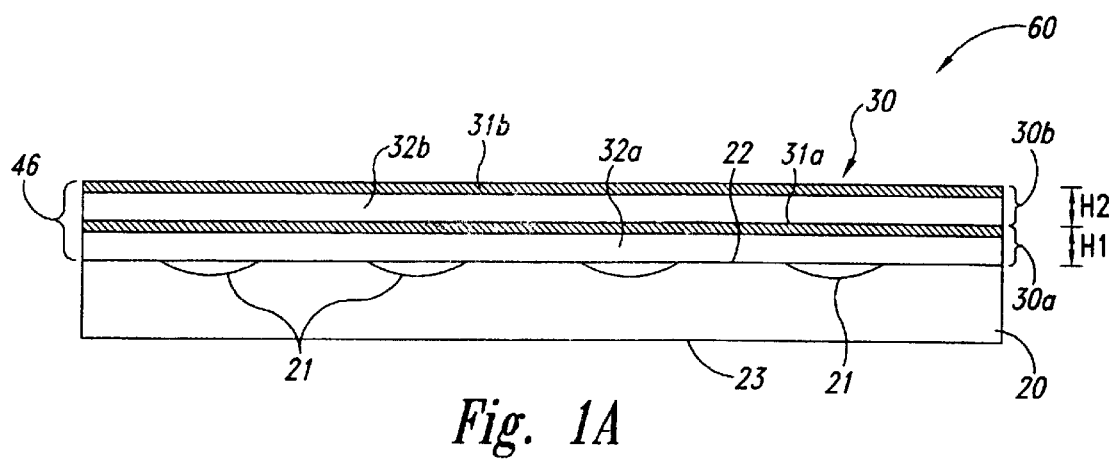
FIGS. 1A–G are partially schematic, cross-sectional side elevational views depicting a process for forming a packaged microelectronic device having a first level of conductive structures in accordance with an embodiment of the invention.
Figure 1B:
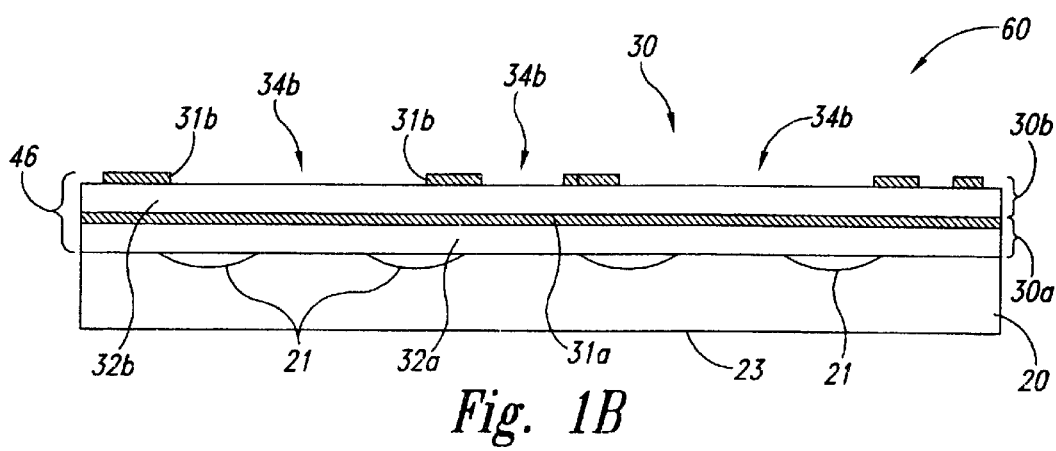

FIGS. 1A–1G illustrate a method for forming a portion of a microelectronic device package 60 in accordance with embodiment of the invention. Referring first to FIG. 1A, the package 60 can include a microelectronic substrate 20, such as a silicon substrate, having an upper surface 22 and a lower surface 23 opposite the upper surface 22. A plurality of device features 21 (such as memory cells, transistors, and/or processor components, shown schematically in FIG. 1A) are formed at the upper surface 22. The microelectronic substrate 20 can include a memory chip, such as a dynamic random access memory (DRAM) chip, a static random access memory (SRAM) chip, a read-only memory (ROM) chip, a random access memory (RAM) chip, a microprocessor chip, a logic chip, a digital signal processing chip, an analog signal processing chip, or an application specific integrated circuit (ASIC) chip. In any of these embodiments, additional device features (not shown) may also be formed beneath the upper surface 22 of the microelectronic substrate 20. The device features 21 can be connected to each other and to external terminals of the package 60 with suspended or partially suspended conductive links (described in greater detail below with reference to FIG. 1G). In one embodiment, the conductive links are grouped in discrete levels or strata, with a first level 46 positioned on the upper surface 22 of the substrate 20, and subsequent levels stacked on the first level 46.

In one aspect of this embodiment, the first level 46 is initially filled with a sacrificial support structure or mandrel 30. The sacrificial support structure 30 can include a lower level portion 30a disposed on the substrate upper surface 22 and an upper level portion 30b disposed on the lower level portion 30a. Each level portion 30a, 30b can include a bulk support material 32 (shown as a lower support layer 32a and an upper support layer 32b) and an etch stop material 31 (shown as a lower etch stop layer 31a and an upper etch stop layer 31b). The etch stop material 31 can include an oxide (such as silicon dioxide), a nitride (such as silicon nitride) or other selectively removable materials. The bulk support material 32 can include carbon or a polymer (such as a photoresist material, a polyimide, parylene or parylene-C) so long as the bulk support material 32 is rigid enough to support the conductive links, but can also be easily removed from adjacent to the conductive links without damaging the conductive links, as described in greater detail below.

In another aspect of this embodiment, the lower support layer 32a and the lower etch stop layer 31a have a combined height or thickness Hi that corresponds to the height of the gap beneath the suspended portions of the conductive links in the first level 46. The upper support layer 32b and upper etch stop layer 31b have a combined height or thickness H2 that corresponds to the thickness of the suspended portions of the conductive links in the first level 46.

Figure 1C:
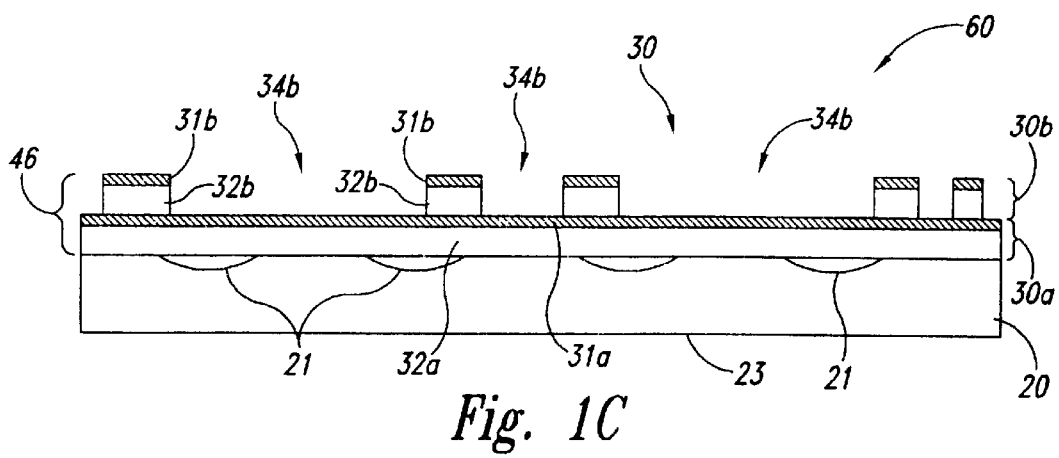
Figure 1D:
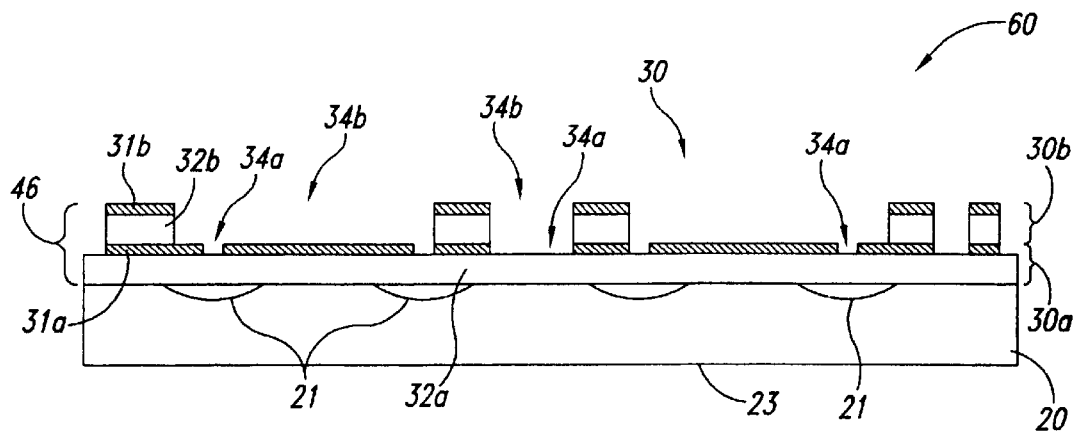
Figure 1E:
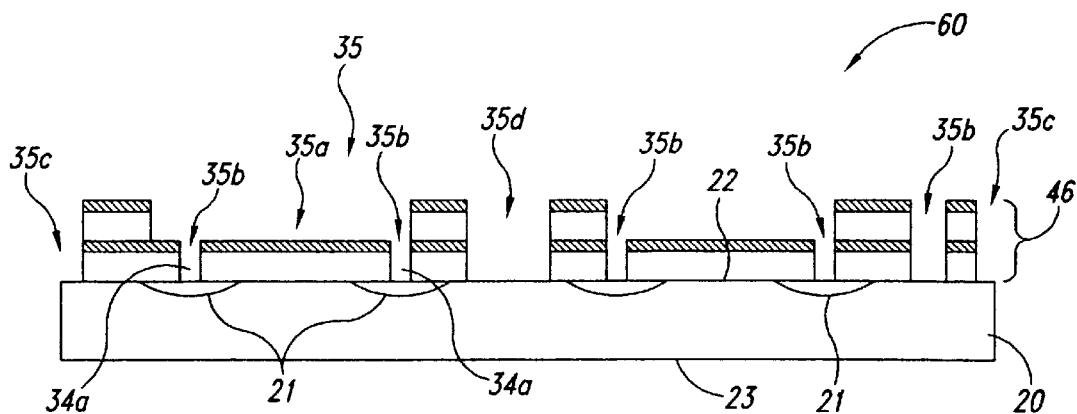

In one embodiment, the conductive links and other conductive components are formed in the first level 46 using a dual damascene process. For example (referring now to FIG. 1B), upper level apertures 34b are etched into the upper etch stop layer 31b using a conventional mask and photoresist process. In FIG. 1C, the upper support layer 32b is etched to extend the upper level apertures 34b down to the lower etch stop layer 31a. As shown in FIG. 1D, a second mask and photoresist process is used to form lower level apertures 34a in the lower etch stop layer 31a. As shown in FIG. 1E, the lower level apertures 34a are extended down to the upper surface 22 of the substrate 20 by etching through the lower support layer 32a. The lower level apertures 34a and the upper level apertures 34b together define a plurality of cavities 35 extending entirely through the sacrificial support material 30. The cavities 35 include laterally extending cavities 35a that are generally parallel to the upper surface 22 of the substrate 20 and define the suspended portion of the conductive links. The cavities 35 also include vertical cavities 35b (defining vias of the conductive links) that couple the lateral cavities 35a to the device features 21. Additional vertical cavities 35c and 35d define conductive external wall portions and conductive internal support structures, respectively, of the package 60.

Figure 1F:
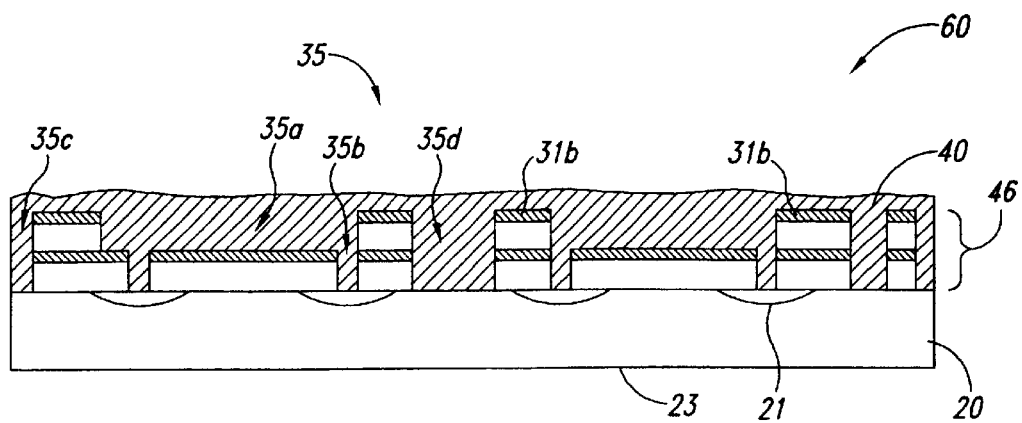
Figure 1G:
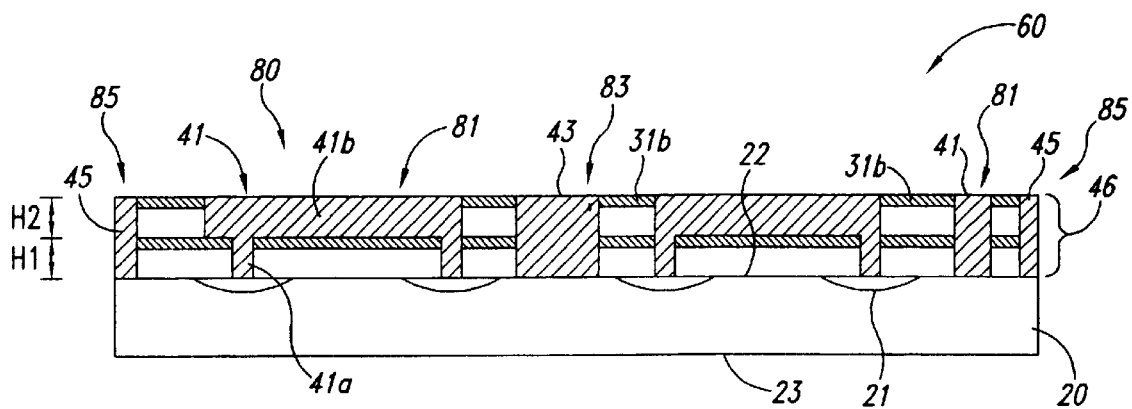

Referring now to FIG. 1F, a conductive material 40 is disposed on the device package 60 to fill in the gaps 35. The conductive material 40 can include copper, aluminum, gold, and/or silver, or the conductive material can include other conductive elements and/or compounds or alloys of these or other elements. In FIG. 1G, the conductive material 40 is planarized (for example, by chemical-mechanical planarization) or otherwise processed to remove excess conductive material 40 down to the level of the upper etch stop layer 31b. Accordingly, the conductive material 40 forms a plurality of electrically and thermally conductive structures 80. Each conductive structure 80 can include a first level portion in the first level 46 connected to corresponding portions in other levels (described below with reference to FIGS. 2–5). For example, the conductive structures 80 can include electrically conductive links 81 having first level portions 41 in the first level 46. The first level portions 41 can include via portions 41a extending transverse to the substrate upper surface 22, and bridge portions 41b extending generally parallel to the substrate upper surface 22.

The conductive structures 80 can further include an internal conductive support 83 with a first level portion 43 that extends transversely to the upper surface 22 within the package 60. The internal conductive support 83 can include a rib that extends a substantial distance transverse to the plane of FIG. 1G, or a post that extends a limited distance transverse to the plane of FIG. 1G. An external wall or cover 85 includes a first level portion 45 that extends transversely to the substrate upper surface 22 along the outer periphery of the substrate 20 to encapsulate both the substrate 20 and the other conductive structures.

Both the internal conductive support 83 and the external wall 85 can support other structures in levels above the first level 46. Alternatively, (for example, when the package 60 is a "flip chip"), the internal conductive supports 83 and the external wall 85 can be sized to support the substrate 20 when the package 60 is inverted. When several packages 60 are initially formed on the same substrate 20, the external walls 85 can also be sized to account for the width of a blade or other cutting medium that singulates adjacent completed packages 60 from each other.

Figure 2:
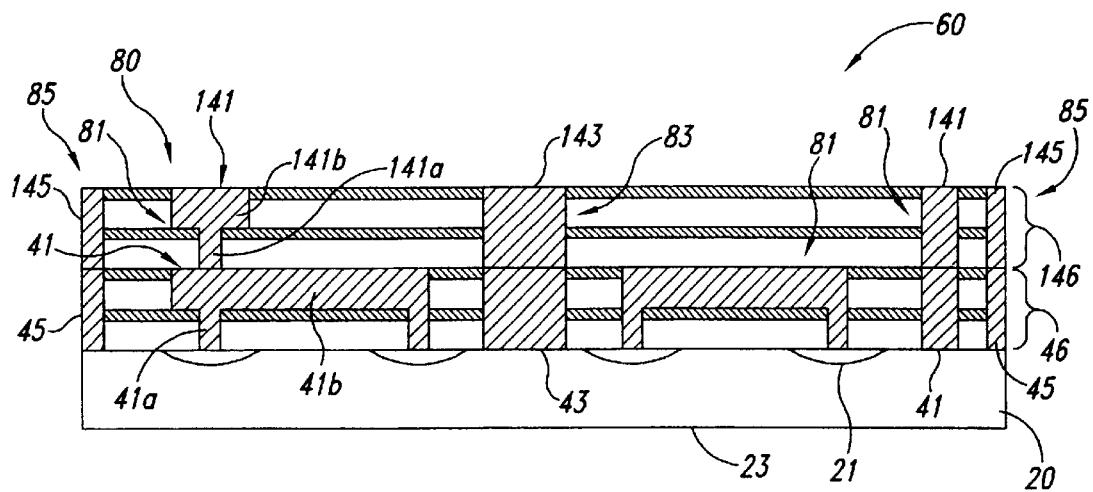
FIG. 2 is a partially schematic, cross-sectional side elevational view of the device shown in FIG. 1G having a second level of conductive structures in accordance with an embodiment of the invention.

FIG. 2 is a partially schematic, side elevational view of the package 60 shown in FIG. 1G having a second level 146 of conductive structures in accordance with an embodiment of the invention. The conductive structures in the second level 146 can be formed on top of the conductive structures in the first level 46 using process steps generally similar to those described above with reference to FIGS. 1A–1G. The conductive structures in the second level 146 can include second level portions 141 of the conductive links 81 described above with reference to FIG. 1G. The second level portions 141 can include horizontal bridge portions 141b and vertical via portions 141a connected to the first level portions 41 in the first level 46 below. Similarly, second level portions 143 of the internal conductive support 83 are connected to the first level portions 43 below, and second level portions 145 of the external wall 85 are connected to the first level portions 45 in the first level 46.

In one aspect of an embodiment shown in FIG. 2, the bridge portions 141b of the conductive links 81 in the second level 146 extend transverse to the plane of FIG. 2, and the bridge portions 41b of the conductive links 81 in the first level 46 extend parallel to the plane of FIG. 2. Accordingly, the orientation of the conductive links 81 can alternate with each successive level to reduce the likelihood for physical interference between conductive links 81 in the same level.

Figure 3:
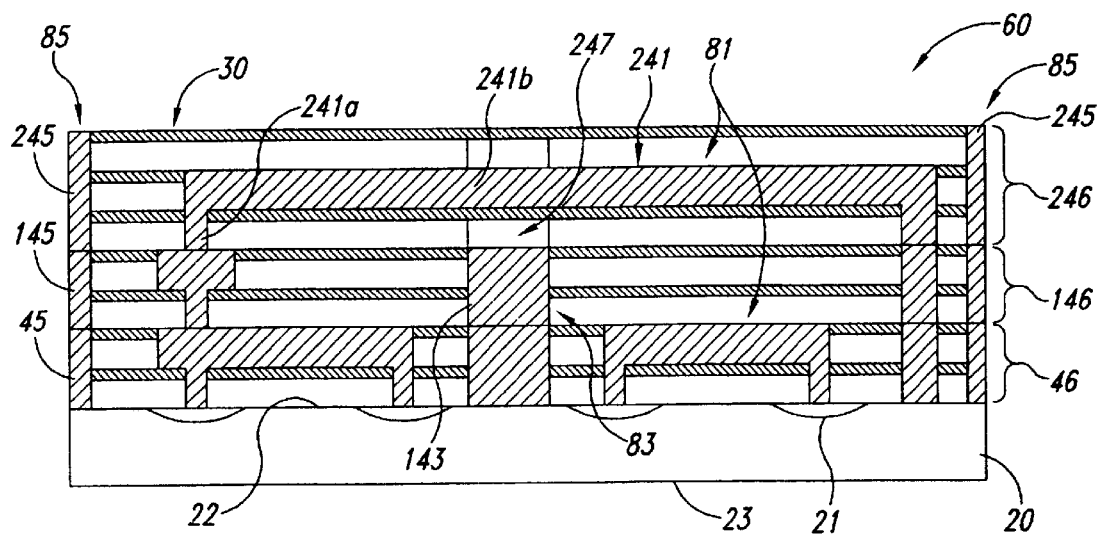
FIG. 3 is a partially schematic, cross-sectional side elevational view of the microelectronic device shown in FIG. 2 having a third level of conductive structures in accordance with an embodiment of the invention.

FIG. 3 is a partially schematic, side elevational view of the package 60 described above with reference to FIGS. 1A–2 having a third level 246 of conductive structures disposed on the second level 146. The third level 246 can be formed using processes generally similar to those described above with reference to FIGS. 1A–1G to form third level portions 241 and 245 of the conductive links 81 and the external wall 85, respectively. The third level portion 241 of the conductive link can include a via portion 241a extending generally transverse to the upper surface 22 of the substrate 20 and a bridge portion 241b extending generally parallel to the upper surface 22.

In one aspect of this embodiment, the third level portion 241 of one or more of the conductive links 81 can extend through the internal support 83. Accordingly, the internal support 83 can have an aperture 247 through which the bridge portion 241b of the conductive link 81 passes, with the bridge portion 241b separated from the walls of the aperture 247. The walls of the aperture 247 are defined in part by the upper surface of the second level portion 143 of the internal conductive support 83 and the lower surface of the third level portion, described below with reference to FIG. 4. The bridge portion 241b can be separated from the walls of the aperture 247 by a gas or a solid insulating material. For example, when the bridge portion 241b is separated from the aperture walls by a gas, the sacrificial support material 30 in the third level 246 can be formed with materials and processes similar to those of the first level 46 and second level 146, so that the sacrificial support material 30 from all three levels can be removed by the same process (described below with reference to FIG. 5). Furthermore, the aperture 247 and the bridge portion 241b can be sized and arranged to prevent the bridge portion 241b from sagging into the walls of the aperture 247. Alternatively, the bridge portion 241b can be supported in the aperture 247 by a non-sacrificial material that remains in place to support the bridge portion 241b after the sacrificial support material 30 has been removed.

Figure 4:
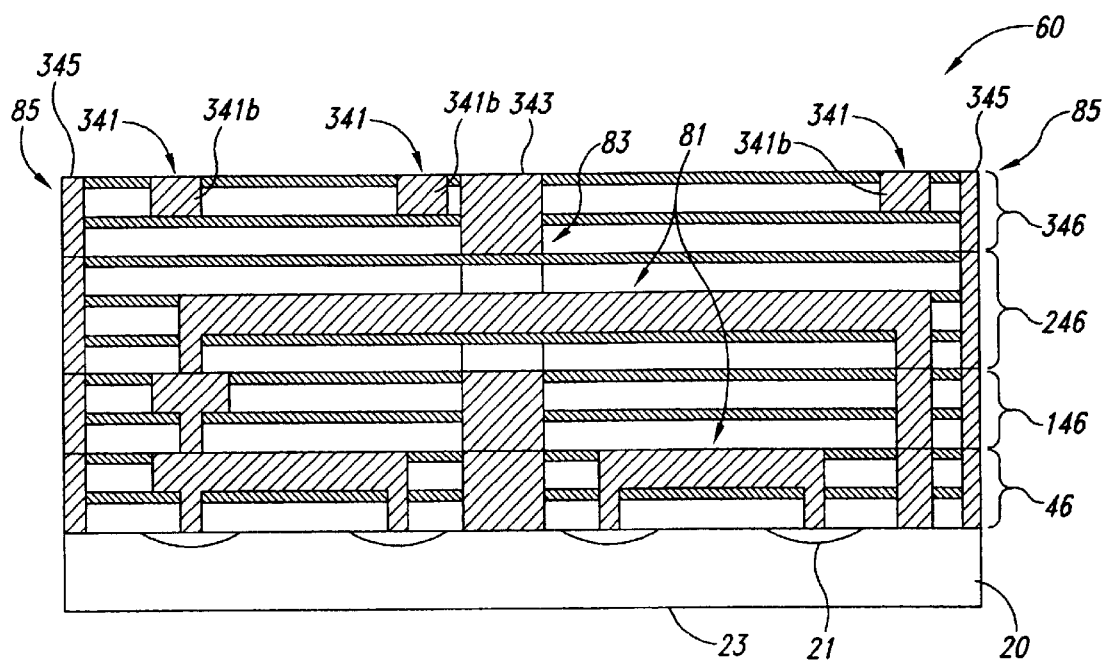
FIG. 4 is a partially schematic, cross-sectional side elevational view of the microelectronic device shown in FIG. 3 having a fourth level of conductive structures in accordance with an embodiment of the invention.

FIG. 4 is a partially schematic, side elevational view of the package 60 described above with reference to FIGS. 1A–3 having a fourth level 346 of conductive structures disposed on the third level 246. The fourth level 346 can include conductive link portions 341 having bridge portions 341b coupled with vias (not visible in FIG. 4) to other portions of the conductive links 81 or to other structures beneath the fourth level 346. The fourth level 346 can also include fourth level portions 343 and 345 of the internal support 83 and the external wall 85, respectively.

Figure 5:
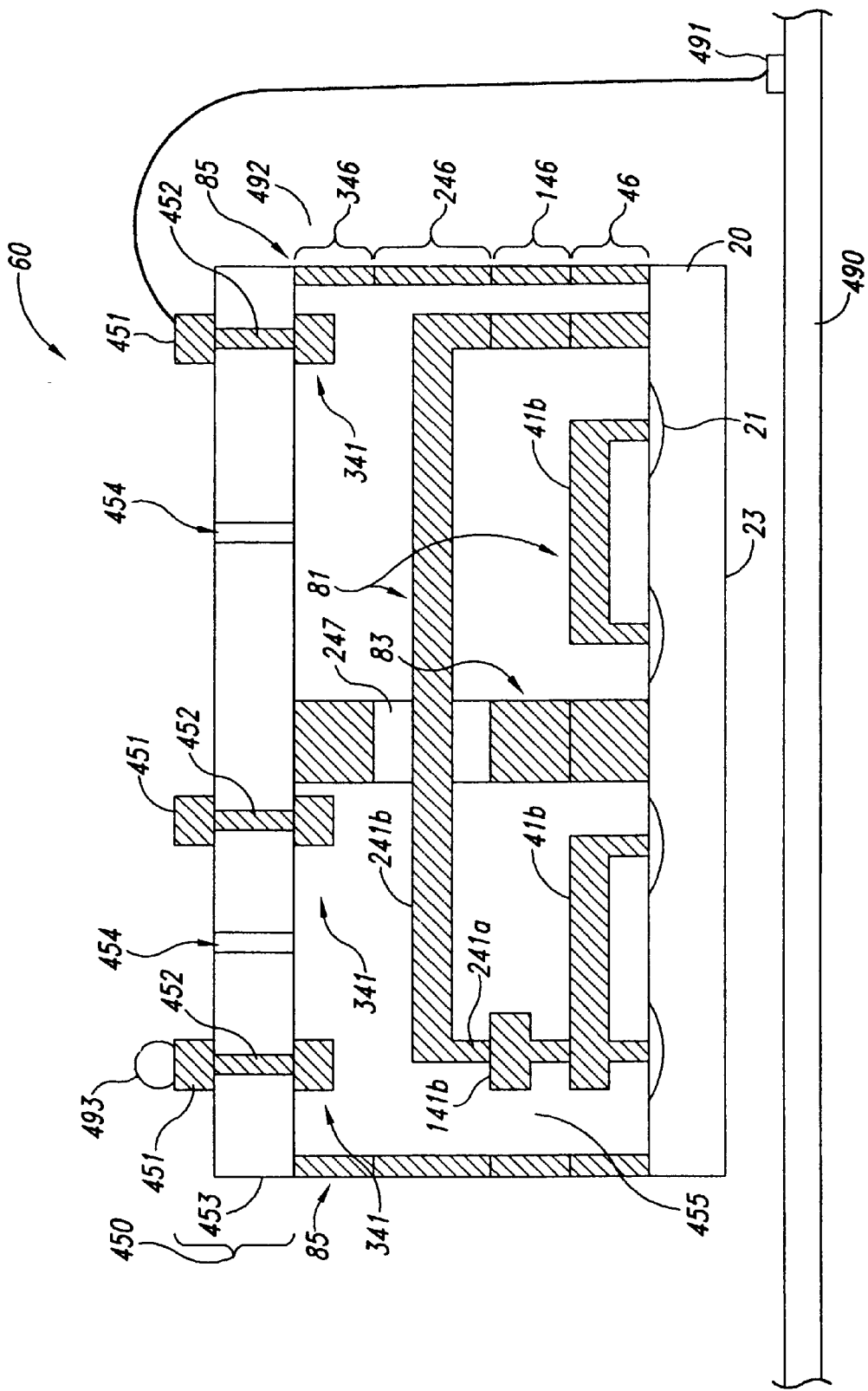
FIG. 5 is a partially schematic, cross-sectional side elevational view of the microelectronic device shown in FIG. 4 having bond pads in accordance with an embodiment of the invention.

FIG. 5 is a partial schematic, side elevational view of the package 60 having a connection structure 450 disposed on the fourth level 346. In one embodiment, the connection structure 450 can include an insulating layer 453 that includes $SiO_2$, $SiON$, $Si_3N_4$, and/or $Al_2O_3$ and/or other generally insulating materials applied to the fourth level 346 by sputtering, chemical vapor deposition, or another conventional technique. The thickness of the insulating layer 453 can be selected to control the capacitive coupling with the conductive structures of the underlying levels.

In one aspect of this embodiment, a very thin layer of an adhesive material, such as zirconium, titanium, and/or chromium can be applied to the upper surface of the fourth level 346 to improve adhesion between the insulating layer 453 and the metal components of the fourth level 346. In another aspect of this embodiment, the mechanical stress of the insulating layer 453 can be reduced by implanting a small dose of inert or other ions into the insulating layer 453. Alternatively, a metal strengthener can be deposited on the insulator (rather than reducing mechanical stress of the insulator itself). The metal can include a material such as titanium, which has a high elastic modulus, low density, and high resistivity. The stress in the metal layer can be reduced by implanting a small dose of inert or other ions into the metal layer, or (when the metal layer is sputtered), by controlling the sputtering parameters.

In any of the embodiments described above for forming the connecting structure 450, bond pads 451 are connected through the insulating layer 453 (and the metal strengthening layer, if present) to the conductive links 81. For example, vias 452 can extend between the bond pads 451 and the fourth level portions 341 of the conductive links 81. The bond pads 451 and vias 452 can be formed by conventional processes, such as photolithography in combination with reactive ion etching. When reactive ion etching is used and the fourth level portions 341 include copper, the copper can provide an etch stop. When the fourth level portions 341 include other materials, other processes (such as other etching processes) can be used to form the vias 452 and the bond pads 451.

In one embodiment, access openings 454 are formed in the insulating layer 453 and penetrate through the insulating layer 453 to the fourth level 346. The access openings 454 allow the sacrificial support structure 30 (FIG. 1A) to be removed from within the package 60. For example, when the sacrificial support structure 30 includes oxides and polymers, these materials can be removed with an oxidation or plasma process. In one aspect of this embodiment, the process can be completed at high pressure (such as ten atmospheres or greater). Any oxidation of the bond pads 451 can subsequently be removed using an inert ion plasma.

The resulting package 60 (shown in FIG. 5 with the sacrificial support structure removed) includes conductive links 81 having bridge portions 41b, 141b, 241b that are suspended between spaced apart endpoints and are surrounded by a low dielectric gas 455, such as air. FIG. 5 also shows the aperture 247 in the support structure 83 through which the second level bridge portion 241b passes. In an alternative embodiment, the air can be evacuated from the package 60 and replaced with other gases (such as argon or helium) that also have low dielectric constants but may have a higher heat conductivity for improved heat transfer from components within the package 60 to the external walls of the package 60. In either embodiment, the access openings 454 are then sealed to prevent or at least restrict changes to the environment within the package 60. Accordingly, the external wall 85 and the connection structure 450 can define an enclosure sealably disposed around the microelectronic substrate 20. In still further embodiments, the gas within the package 60 can be pressurized, as described in greater detail below with reference to FIGS. 6A–F.

Figure 6A:
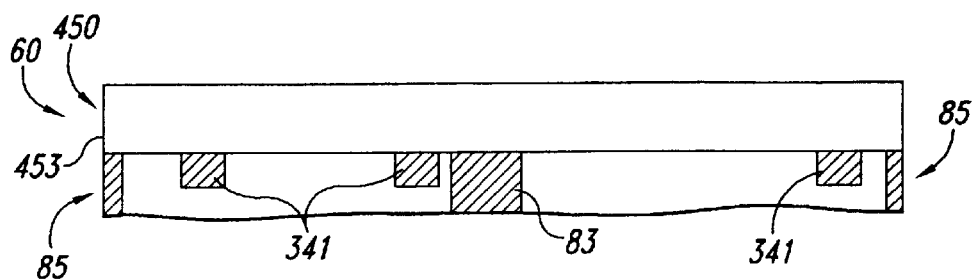
FIGS. 6A–F are partially schematic, cross-sectional side elevational views depicting a process for filling a microelectronic device package with liquid or pressurized gas in accordance with an embodiment of the invention.

FIGS. 6A–F illustrate an embodiment of a method for disposing a pressurized gas, or a liquid, in the package 60 described above with reference to FIGS. 1A–5. FIG. 6A illustrates an upper portion of the package 60 described above with reference to FIG. 5, prior to forming the access openings 454. Accordingly, the package 60 shown in FIG. 6A has the insulating layer 453 of the connecting structure 450 disposed on the external wall 85 and adjacent to the conductive link portions 341 and the conductive support 83.

Figure 6B:
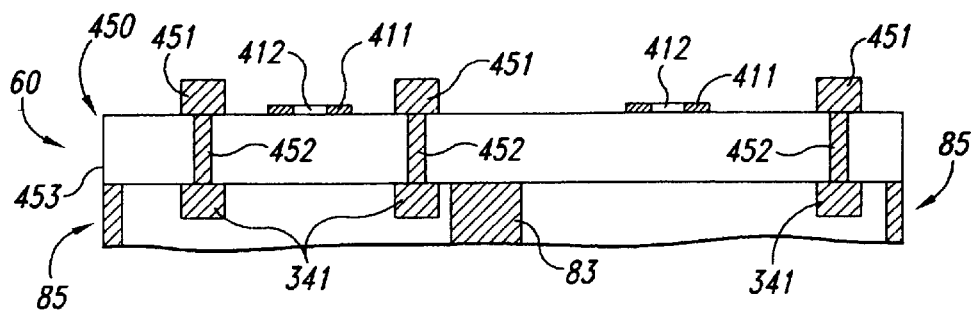

Turning now to FIG. 6B, the bond pads 451 and the vias 452 can be formed in a manner generally similar to that described above with reference to FIG. 5 to provide an electrical link between the bond pads 451 external to the package 60 and the conductive link portions 341 internal to the package 60. In a further aspect of this embodiment, one or more seal bond rings 411 can be formed simultaneously with forming the bond pads 451 and/or the vias 452. Alternatively, the seal bond rings 411 can be formed independently of the bond pads 451 and/or the vias 452. In either embodiment, each seal bond ring 411 can have an aperture 412 aligned with a location of one of the access openings 454. The seal bond rings 411 can include the same material as the bond pads 451 in one embodiment, or alternatively, the seal bond rings 411 can include other materials. In either embodiment, the seal bond rings 411 can be configured to form a gas-tight or liquid-tight seal, as described in greater detail below.

Figure 6C:
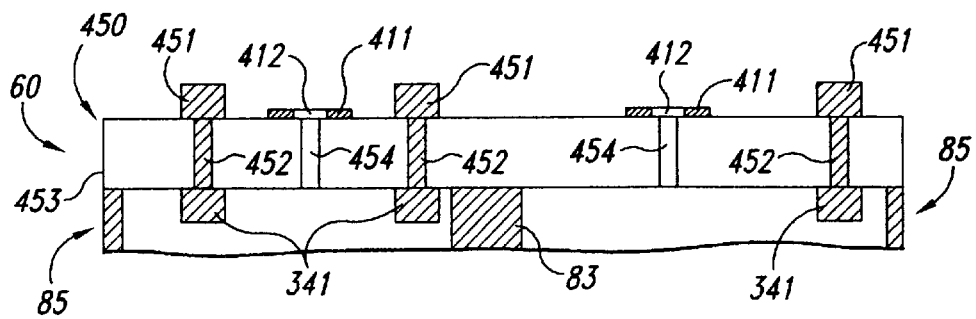
Figure 6D:
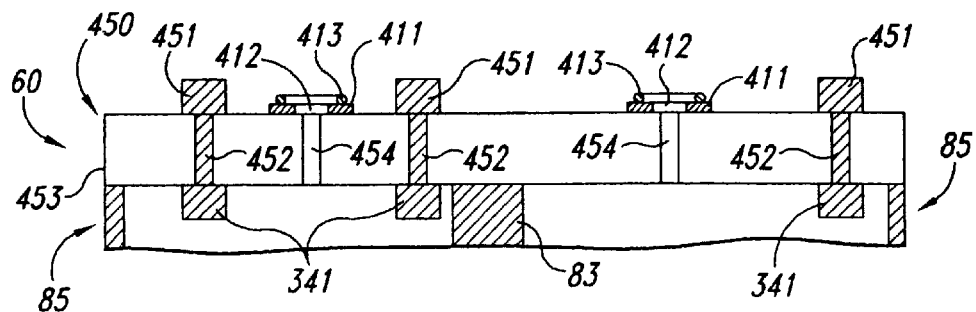
Figure 6E:
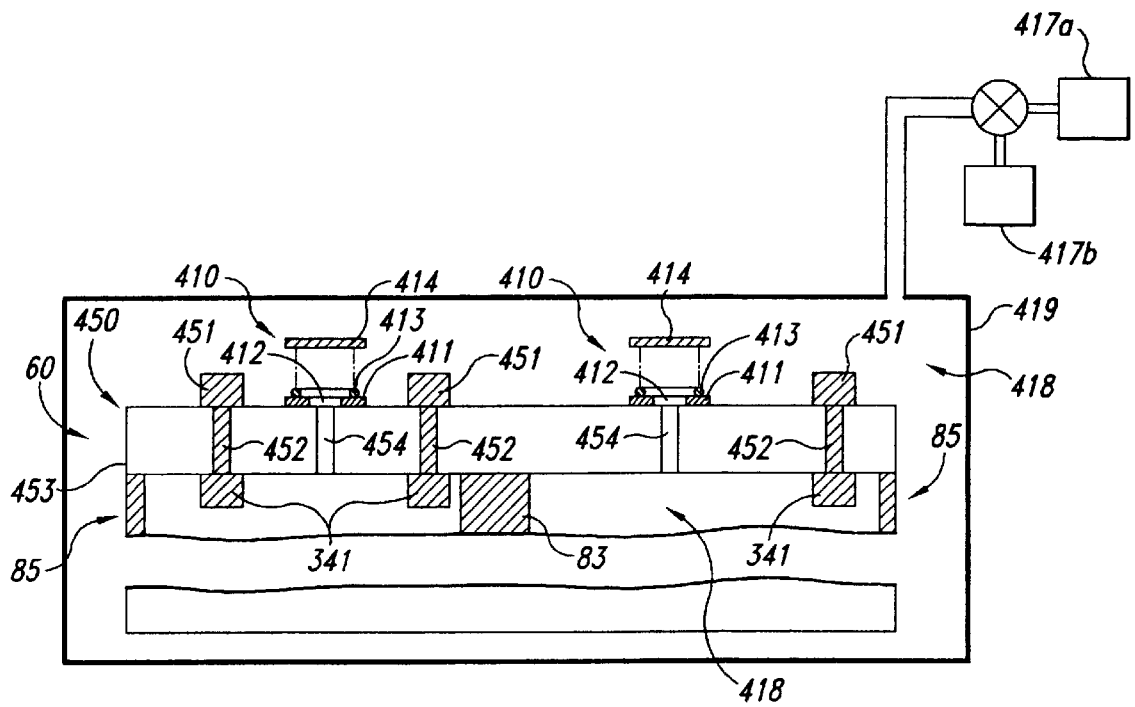

Referring now to FIG. 6C, the access openings 454 are formed in the insulating layer 453 of the connecting structure 450. The access openings 454 can be aligned with the apertures 412 of the seal bond rings 411 to extend into the interior of the package 60. Accordingly, the access openings 454 can provide temporary communication between the interior and the exterior of the package 60. As shown in FIG. 6D, a solder ring 413 can then be disposed on each seal bond ring 411. The package 60 is then exposed to an oxidizing agent or plasma, as described above with reference to FIG. 5, to remove the sacrificial support structure within the package 60.

After the sacrificial support structure has been removed from the enclosure 60, any gaseous byproducts can be removed from the package 60, for example by placing the package 60 in a pressure chamber 419 (shown in FIG. 6E) and coupling the pressure chamber 419 to a vacuum source 417a. Once the enclosure 60 has been purged, the pressure chamber 419 can be coupled to a pressurized gas source 417b to charge the enclosure 60 with a gas 418 selected to be generally electrically insulative but thermally conductive. For example, in one embodiment, the gas 418 can include helium, hydrogen, or a mixture of helium and hydrogen. An advantage of helium is that it is inert and has a relatively high thermal conductivity. An advantage of hydrogen is that it has a relatively low diffusivity through typical microelectronic substrate and packaging materials. A further advantage of hydrogen is that it is a reducing agent and can accordingly control or eliminate the potentially corrosive effects of any oxygen remaining in the package 60.

In one embodiment, the relative amounts of helium and hydrogen selected for the package 60 may depend upon the application for which the package is intended. For example, when the package 60 is to be placed in an environment demanding a high heat transfer rate, the gas 418 can be primarily or entirely hydrogen because hydrogen is more thermally conductive than helium at the same pressure. Conversely, when the package 60 is to be placed in an environment where the heat transfer requirements are lower and/or the gas 418 is subject to certain handling constraints, the gas 418 can be primarily or entirely helium. In other embodiments, the gas 418 can have other compositions.

In any of the foregoing embodiments, the pressure of the gas 418 within the pressure chamber 419 (and therefore within the package 60) can be elevated to be at least one atmosphere above atmospheric pressure. In a further aspect of this embodiment, the pressure of the gas 418 can be elevated to be from about 5 atmospheres to about 50 atmospheres above atmospheric pressure. Accordingly, the package 60 will become filled with the gas 418 at a pressure elevated will beyond atmospheric pressure.

Figure 6F:
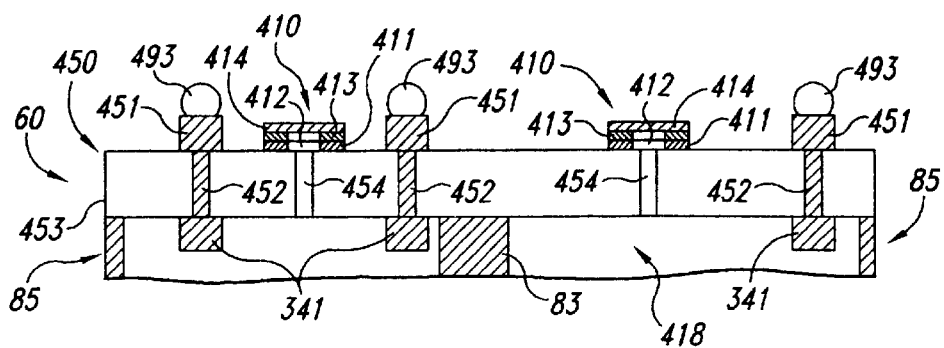

Once the package 60 has been filled with the gas 418, the access openings 454 can be sealed to prevent or at least restrict the gas 418 from escaping when the package 60 is exposed to atmospheric pressure. In one embodiment, a seal lid 414 can be positioned on the solder ring 413, and the temperature of the pressure chamber 419 can be elevated until the solder ring 413 melts and bonds the seal lid 414 to the seal bond ring 411. After the solder ring 413 has cooled, the package 60 can be removed from the pressure chamber 419, as shown in FIG. 6F, with the seal lid 414, the solder ring 413, and the seal bond ring 411 forming a seal 410 that prevents or at least restricts the gas 418 from escaping from the package 60. In other embodiments, the seal 410 can have other configurations. In any of these embodiments, the solder balls 493 can then be applied to the bond pads 454. In one aspect of this embodiment, the melting point of the solder balls 493 can be less than the melting point of the solder ring 413 so that the solder balls 493 can be applied to the bond pads 451 and connected to other external conductive structures without compromising the integrity of the seal 410. In other embodiments, the seal lid 414 can be applied to the seal bond ring 411 after the external connections are made to the bond pads 451. In such embodiments, the melting point of the solder ring 413 can be less than the melting point of the solder ball 493 so as not to disturb the connection between the bond pads 451 and any external conductive elements to which the bond pads 451 are attached.

In any of the foregoing embodiments described above with reference to FIGS. 1A–6F, a feature of the package 60 is that the space between conductive links and other electrically conductive structures can be charged with a pressurized gas 418. An advantage of this arrangement is that the pressurized gas provides a low dielectric separator between adjacent conductors, and can more efficiently and effectively transfer heat away from the conductive links 81 to the walls 85 of the package 60, and ultimately away from the package 60. Accordingly, the package 60 can be more robust than conventional packages because it can last longer and/or perform more efficiently or reliably.

A further advantage of an embodiment of the package and process described above is that the package can be initially pressurized to levels substantially above atmospheric pressure, for example, from about 5 to about 50 atmospheres above ambient pressure. Accordingly, even if the gas slowly leaks from the package, the pressure within the package can remain well above atmospheric pressure over the expected life of the package. This is unlike some conventional devices which are pressurized to a level just high enough to balance the amount of gas expected to leak from the package over the life of the package. Such conventional devices are configured to have an internal pressure just above atmospheric pressure by the end of the expected life span of the package, due to gas leakage from the package, and accordingly may be more likely to overheat as the package ages.

Another feature of an embodiment of the process described above with reference to FIGS. 1A–6F is that the permanent conductive structures 80 in each level can be formed from the same material. For example, the external wall portion 85, the conductive links 81, and the internal support structures 83 can include the same conductive material. One advantage of this feature is that the portions of these structures within each level can be formed simultaneously, for example by depositing all the conductive material in each level in a single step. Accordingly, an embodiment of the method can reduce the number of steps required to form the package 60, when compared with conventional methods that may include disposing different materials for the external wall, internal structures and/or conductive links.

Yet another advantage of this feature is that a greater portion of the package 60 is formed from materials having relatively high heat conductivity. Accordingly, it can be easier to transfer heat away from the package 60 and reduce the temperature at which the package operates, which is expected to increase the operating life and/or the performance characteristics of the package 60.

Once the package 60 is complete, it can be singulated from adjacent packages (not shown) and joined to a support substrate for coupling to other electronic components. For example, in one embodiment, the package can be attached to a printed circuit board 490 or other substrate by adhesively bonding the microelectronic substrate 20 to the printed circuit board and attaching wire bonds 492 between the bond pads 451 of the package 60 and corresponding contacts 491 on a printed circuit board 490. When the package 60 is configured to be positioned uprightly on the support substrate, the external walls 85 and the internal structures 83 are sized to support only the connection structure 450 and the forces resulting from connecting wire bonds to the connection structure 450.

Alternatively, the package 60 can be configured as a "flip chip" by attaching the solder balls 493 to the bond pads 451 and inverting the package 60 so that the solder balls 493 contact corresponding ball pads on the printed circuit board 490 or other support substrate. When the package 60 is configured as a flip chip, the external walls 85 and internal support structures 83 are sized to support the microelectronic substrate 20.

In another aspect of this embodiment, the package 60 can be inverted, placed on the supporting substrate 490, and bonded to the substrate 490, all before removing the sacrificial support structure 30 from the package 60. An advantage of this method is that the sacrificial support structure 30 remains in place during more processing steps than it does with conventional techniques, reducing the likelihood for portions of the package 60 to collapse during these process steps.

In other embodiments, the process described above with reference to FIGS. 1A–6F can have other variations. For example, the processes can form packages 60 having more or fewer levels than are shown in FIGS. 1A–6F. In one embodiment, the sacrificial support structure 30 can include a single layer of material rather than the upper level portion 30b and the lower level portion 30a described above with reference to FIG. 1A. In a further aspect of this embodiment, the single layer can include a single bulk material rather than a bulk material in combination with an etch stop material. The bulk material can include carbon or a polymer, such as a photoresist material. The cavities 35a–d (FIG. 1E) can be formed in the single material using a dual damascene process. For example, the cavities in the first level 46 that extend all the way through the sacrificial support structure 30 (such as the via cavities 35b, external wall cavities 35c and internal wall cavities 35d) are etched first, using a first mask and photoresist process, with the substrate upper surface 22 forming an etch stop layer. The cavities corresponding to structures that extend only partway through the first level 46 (for example, the lateral cavities 35a) are formed by using a timed etch to stop short of the upper surface 22 of the substrate. The end result is a series of cavities 35 that look similar or identical to those shown in FIG. 1F. These cavities can be filled simultaneously with a metal, as described above with respect to FIG. 1F. A plasma process is then used to remove the polymer layers, leaving the conductive structures 80 (FIG. 5) in place.

When the sacrificial support structure 30 includes carbon, the cavities 35 can also be formed with a dual damascene process. The carbon can be exposed to a high temperature oxygen atmosphere to reduce the carbon to $CO_2$, again leaving the conductive structures 80 in place. In other embodiments, the sacrificial support structure 30 can include other materials, so long as these materials can be removed from the package 60, for example, using a wet etch, plasma etch, or oxidation process.

In still further embodiments, processes other than a dual damascene process can be used to form the cavities in the sacrificial support structure 30. For example, two single damascene processes can be used to first form those portions of the conductive structures 80 that contact the level below, and then form the portions of the conductive structures 80 that are suspended above the level below. An advantage of the dual damascene process is that the conductive material forming both portions of the conductive structures 80 are disposed in a single step, reducing the likelihood for physical and/or electrical disconnects between portions of the conductive structures within a single level.

In yet another embodiment, at least some of the structures 80 described above with reference to FIGS. 1A–6F can include insulating materials. For example, portions of the internal support structure 83 and the external wall 85 (or alternatively, the entire internal support structure 83 and external wall 85) can include an insulating material. An advantage of forming all or part of the internal support structure 83 with insulating materials is that the structure can contact the conductive links 81 without causing short circuits between the links. Conversely, an advantage of forming the internal support structure 83 and external wall portions 85 from the same conductive material as other conductive structures of the package 60 is that such structures can be formed simultaneously, as described above, and can enhance the rate at which heat is transferred from the package 60.

In yet another embodiment, the external wall 85 can be initially formed on the substrate 20 simultaneously with the conductive internal structures (such as the conductive links 81 and the internal support structure 83), and can subsequently be further processed. For example, the external wall 85 can be plated or otherwise treated to reduce the likelihood for corrosion of the external wall or other detrimental environmental effects.

In still another embodiment, an initially separate heat sink (not shown) can be attached to the package 60 after the package 60 has been formed. For example, when the package 60 has a flip chip configuration, the heat sink can be attached to the lower surface 23 (FIG. 1A) of the microelectronic substrate 20, which is exposed when the package 60 is flipped. Alternatively, when the package 60 remains upright, the heat sink can be attached to the connection structure 450, so long as the heat sink does not interfere with the wire bonds or other connecting elements attached to the bond pads 451. In either embodiment, the heat sink can improve the rate at which heat is transferred away from the package, increasing the performance and/or life expectancy of the package.

In yet another embodiment, the package 60 described above with reference to FIGS. 1A–6F can be charged with a liquid instead of a gas. For example, in one embodiment, the package 60 can be placed in the pressure chamber 419 (FIG. 6E), and the pressure within the chamber 419 can be reduced to remove some or all of the gas from the package 60. The package 60 can then be filled with a liquid, such as carbon tetrachloride. Alternatively, the package 60 can be filled with another liquid, such as an organic liquid or any liquid that is thermally conductive but electrically generally non-conductive. In one aspect of this embodiment, the liquid can have a greater thermal conductivity than the pressurized gas 418 described above with reference to FIG. 6E. The liquid can also be selected to be generally non-reactive with the internal components of the package 60.

Figure 7:
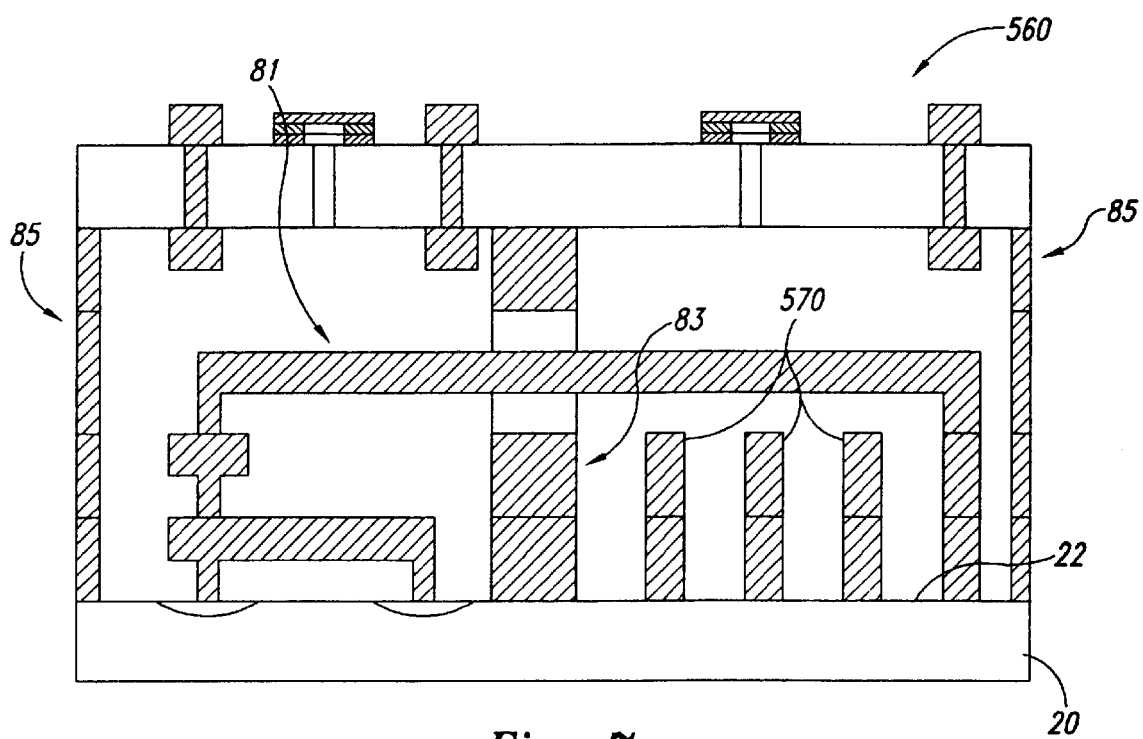
FIG. 7 is a partially schematic, cross-sectional side elevational view of a packaged microelectronic device having internal conductive heat transfer structures in accordance with another embodiment of the invention.

FIG. 7 is a partially schematic, side elevational view of a package 560 having internal heat transfer structures 570 that improve the rate of heat transfer from the package 560 in accordance with another embodiment of the invention. In one aspect of this embodiment, the heat transfer structures 570 extend upwardly from the upper surface 22 of the substrate 20. Alternatively, the heat transfer structures 570 can be connected to other portions of the package 560. In either embodiment, the heat transfer structures 570 do not provide structural support or electrical connections for the package 560, but instead are provided solely to transfer heat from within the package 560, for example, by transferring heat from the substrate 20 to the interior of the package where the heat can be absorbed by the external wall 85. The heat can be removed from the external wall 85 to the environment around the package 560 by convention, conduction and/or radiation. Accordingly, the heat transfer structures 570 can be coupled to the substrate 20, the external walls 85 and/or other structures within the package 560. The heat transfer structures 570 can include fins, ribs, posts or other structures with shapes suited for high heat transfer rates. In one aspect of this embodiment, the heat transfer structures 570 can be formed according to any of the processes described above with reference to FIGS. 1A–6F, for example, by simultaneously depositing successively stacked portions of the heat transfer structures 570, along with the portions of the external walls 85, internal support structures 83, and conductive links 81. Alternatively, the heat transfer structures 570 can be formed by other processes.

Figure 8:
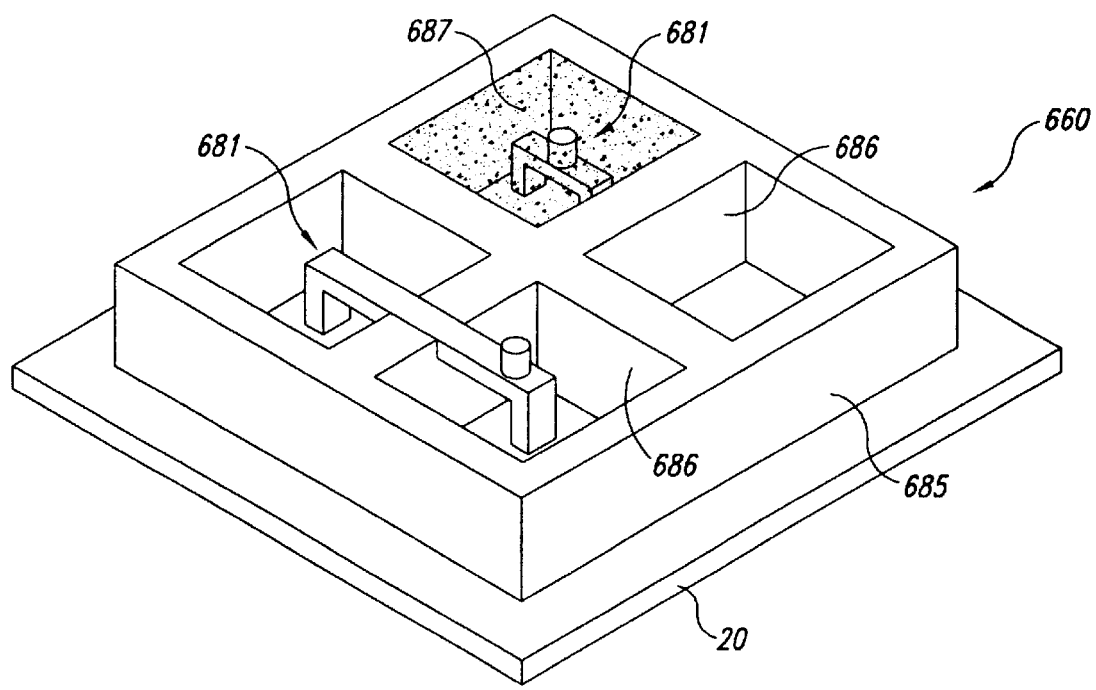
FIG. 8 is a partially schematic isometric view of a portion of a packaged microelectronic device having internal ribs in accordance with an embodiment of the invention.

In other embodiments, the package 60 can have other arrangements that include suspended conductive links. For example, as shown in FIG. 8, a package 660 in accordance with one embodiment of the invention can include walls 685 and ribs 686 disposed on the microelectronic substrate 20. The walls 685 and the ribs 686 can include an electrically insulative inorganic material, such as silicon dioxide, low temperature silicon dioxide, or silicon nitride. The package 660 can also include conductive links 681, with the conductive links 681, the walls 685, and the ribs 686 formed in stacked layers (one of which is shown in FIG. 8) in a manner generally similar to that described above, and described in U.S. application Ser. No. 09/382,929.

One feature of an embodiment of the package 660 shown in FIG. 8 is that the walls 685 may be able to withstand higher internal pressures than the external walls 85 described above with reference to FIGS. 1A–6F because the ribs 686 can strengthen the walls 685. Accordingly, the package 660 may be able to contain a thermally conductive gas at a higher pressure to more efficiently transfer heat away from the conductive links 681.

In yet another embodiment, the conductive structures in contact with the pressurized gas within the enclosure 660 need not be suspended between two points. For example, the enclosure 660 can include a foam 687 that partially fills the volume between the conductive links 681 and the external walls 685 and the ribs 686. The pores within the foam 687 can be charged with pressurized gas, in a manner generally similar to that described above. In other embodiments, the enclosure 660 can have other arrangements, so long as the pressurized gas is in contact with the conductive links 681 for transferring heat away from the conductive links 681.

Figure 9:
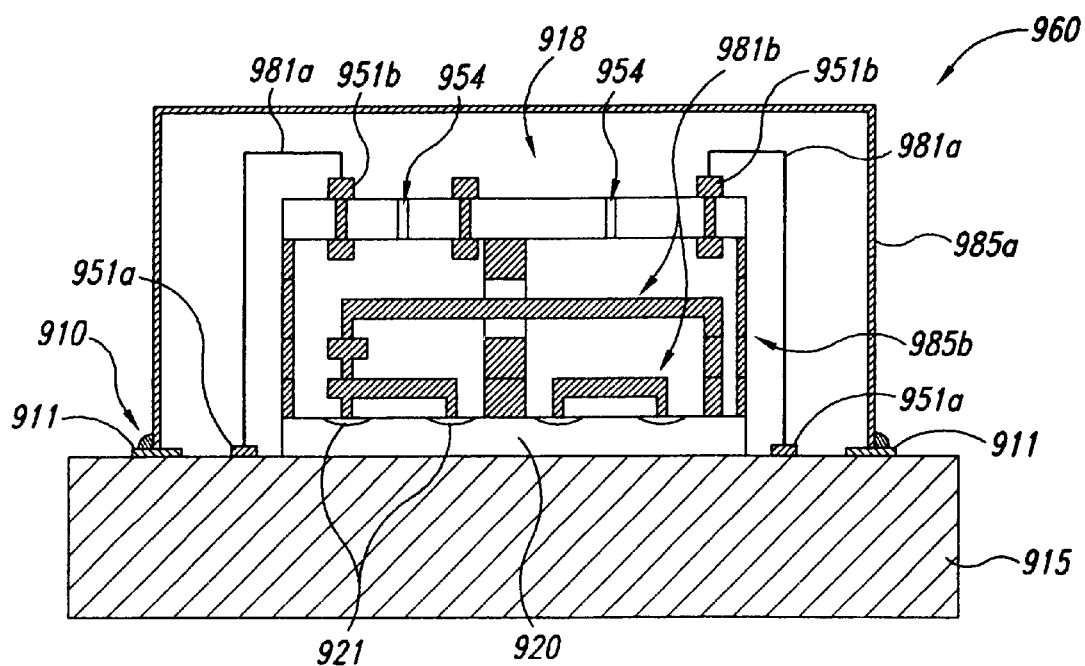
FIG. 9 is a partially schematic, cross-sectional side elevational view of a packaged microelectronic device containing a pressurized gas in accordance with another embodiment of the invention.

FIG. 9 is a partially schematic, cross-sectional side elevational view of a microelectronic device package 960 in accordance with another embodiment of the invention. In one aspect of this embodiment, the package 960 can include a microelectronic substrate 920 supported on a support substrate 915. The support substrate 915 can include bond sites 951a, (such as bond pads), coupled with conductive links 981a (such as wire bonds) to corresponding bond sites 951b of the microelectronic substrate 920. The package 960 can further include an enclosure 985a positioned to at least partially enclose the microelectronic substrate 920 and the first conductive links 981a. The interior of the enclosure 985a can be charged with a gas 918 under pressure. For example, the gas 918 can include helium and/or hydrogen at a pressure of at least one atmosphere above atmospheric pressure. In a further aspect of this embodiment, the pressure of the gas 918 within the enclosure 985a can be between five atmospheres and 50 atmospheres above atmospheric pressure, as described above.

In any of the foregoing embodiments described above with reference to FIG. 9, the package 960 can include a seal 910 that provides an at least approximately gas-tight seal between the enclosure 985a and the support substrate 915. In one aspect of this embodiment, the seal 910 can include a metallic ring 911 disposed on the support substrate 915, and the first enclosure 985a can be soldered to the metallic ring 911. Accordingly, the package 960 can provide increased thermal conductivity between the conductive links 981a and the enclosure 985a because the gas 918 within the enclosure is pressurized well above atmospheric pressure. The enclosure 985a can include a highly thermally conductive material (such as a metal) to further increase the heat transfer away from the microelectronic substrate 920. Alternatively, the enclosure 985a can include a non-metallic material, such as a ceramic or a plastic.

In any of the foregoing embodiments described above with reference to FIG. 9, the microelectronic substrate 920 can include microelectronic device features 921 that are coupled with second conductive links 981b. The second conductive links 981b can be suspended between the microelectronic device features 921 or, alternatively, the second conductive links 981b can be fully supported, for example, with a foam. In either embodiment, the package 960 can include a second enclosure 985b disposed around the second conductive links 981b and at least a portion of the microelectronic substrate 920. In one aspect of this embodiment, the second enclosure 985b can be sealed with a high-pressure gas that has no fluid communication with the high-pressure gas 918 within the first enclosure 985a. Alternatively, the second enclosure 985b can include one or more apertures 954 that allow for fluid communication between an interior region of the first enclosure 985a and an interior region of the second enclosure 985b.

One feature of an embodiment of the package 960 described above with reference to FIG. 9 is that the pressurized gas 918 within the first enclosure 985a can provide for increased heat transfer away from the first conductive links 981a. An advantage of this arrangement is that the first conductive links 981a can be less likely to overheat, which can prolong the useful life and/or enhance the performance of the package 960. Another feature of an embodiment of the package 960 described above with reference to FIG. 9 is that the interior region of the first enclosure 985a can be in fluid communication with the interior region of the second enclosure 985b via the apertures 954. Accordingly, a single volume of pressurized gas 918 can provide for increased heat transfer away from both the first conductive links 981a and the second conductive links 981b. An advantage of this arrangement is that it can further increase the efficiency with which heat is transferred away from the microelectronic substrate 920. A further advantage of this arrangement is that it may be simpler and/or more convenient to seal the interface between the first enclosure 985a and the support substrate 915 than it is to seal the apertures 954.

Figure 10:
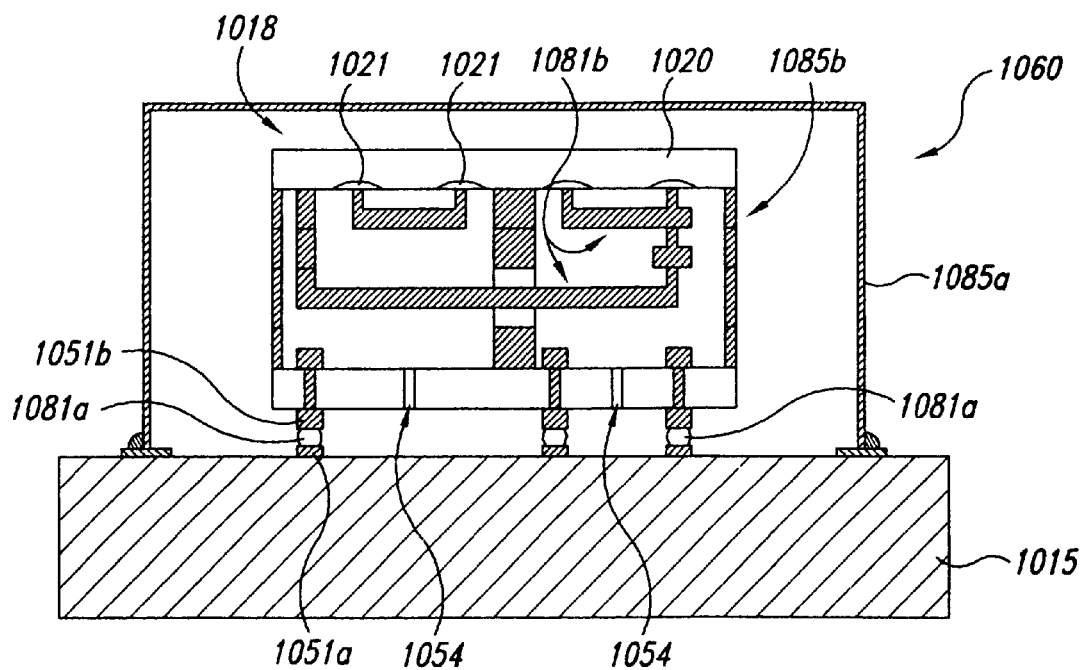
FIG. 10 is a partially schematic, cross-sectional side elevational view of a packaged microelectronic device containing a pressurized gas in accordance with yet another embodiment of the invention.

FIG. 10 is a partially schematic, cross-sectional side elevational view of a microelectronic device package 1060 in accordance with yet another embodiment of the invention. In one aspect of this embodiment, the package 1060 can include a microelectronic substrate 1020 mounted to a support substrate 1015 in a "flip chip" arrangement. The package 1060 can further include a first enclosure 1085a disposed around the microelectronic substrate 1020 and sealed to the support substrate 1015 in a manner generally similar to that described above with reference to FIG. 9. The package 1060 can further include bond pads 1051a on the support substrate 1015 coupled with first conductive links 1081a (such as solder balls) to second bond pads 1051b of the microelectronic substrate 1020. The package 1060 can further include a pressurized gas 1018 within the first enclosure 1085a to improve the rate at which heat is transferred away from the microelectronic substrate 1020.

In one aspect of an embodiment of the package 1060 shown in FIG. 10, the microelectronic substrate 1020 can include microelectronic device features 1021 coupled with second conductive links 1081b that are at least partially suspended in a manner similar to that described above. Alternatively, the second conductive links 1081b can be fully supported, for example, with a foam. In a further aspect of this embodiment, a second enclosure 1085b can be disposed around the second conductive links 1081b. The second enclosure 1085b can include an aperture 1054 that allows for fluid communication between an interior region of the first enclosure 1085a and an interior region of the second enclosure 1085b. Accordingly, the pressure of the gas 1018 within the first enclosure 1085a can be approximately equal to the pressure of the gas within the second enclosure 1085b. As discussed above, an advantage of this feature is that the pressurized gas within the second enclosure 1085b can further enhance the rate at which heat is transferred away from the microelectronic substrate 1020, and the seal between the second enclosure 1085b and the support substrate 1015 can be simpler and/or more convenient than a seal for the aperture 1054.

From the foregoing, it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A microelectronic device package, comprising:
    a microelectronic substrate having at least one microelectronic device feature;
    a conductive link that includes a conductive material and is coupled to the at least one microelectronic device feature; and
    an enclosure sealably disposed around at least a portion of the microelectronic substrate and the conductive link, the enclosure being configured to contain a gas in contact with the conductive link at a pressure at least one atmosphere greater than a pressure external to the enclosure.

2. The package of claim 1 wherein the enclosure has an aperture and a seal sealably positioned proximate to the aperture to at least restrict a flow of gas through the aperture, and wherein the seal includes a metallic ring disposed about the aperture, a solder ring disposed on the metallic ring, and a metallic lid disposed on the solder ring to at least restrict a flow of gas outwardly from the enclosure.

3. The package of claim 1 wherein the enclosure has an aperture and a seal sealably positioned proximate to the aperture to at least restrict a flow of gas through the aperture, and wherein the seal includes a metallic ring disposed about the aperture, a solder ring disposed on the metallic ring, and a metallic lid disposed on the solder ring to at least restrict a flow of gas outwardly from the enclosure, and wherein the gas includes hydrogen and/or helium at a pressure of from about 5 atmospheres to about 50 atmospheres above atmospheric pressure, still further wherein the at least one microelectronic device feature is a first microelectronic device feature, and wherein the microelectronic substrate has a second microelectronic device feature with the conductive link connected between the first and second microelectronic device features and at least a portion of the conductive link suspended between two points positioned between the first and second microelectronic device features.

4. The package of claim 1, further comprising a gas disposed within the enclosure and in contact with the conductive link, the gas having a pressure of at least one atmosphere above a pressure external to the enclosure.

5. The package of claim 1, further comprising a gas disposed within the enclosure and in contact with the conductive link, the gas including at least one of hydrogen and helium.

6. The package of claim 1, further comprising a gas disposed within the enclosure and in contact with the conductive link, the gas having a pressure of from about 5 atmospheres to about 50 atmospheres above a pressure external to the enclosure.

7. The package of claim 1 wherein the enclosure includes an aperture and a seal sealably positioned proximate to the aperture to at least restrict a flow of gas outwardly from the enclosure.

8. The package of claim 1 wherein the enclosure includes a contact structure having electrical contacts with solder balls for coupling the microelectronic package to other components, the contact structure having an aperture for disposing the gas in the enclosure, a seal to close the aperture, and a solder joint between the seal and the contact structure, the solder joint having a melting point higher than a melting point of the solder balls.

9. The package of claim 1 wherein the enclosure includes a contact structure having electrical contacts for coupling the microelectronic package to other components, the enclosure further including walls between the contact structure and the microelectronic substrate, and wherein the walls are configured to support a weight of the microelectronic substrate when the contact surface faces downwardly.

10. The package of claim 1 wherein the microelectronic substrate is supported on a support substrate, the microelectronic substrate having a first bond site electrically coupled to the at least one microelectronic device feature, the support substrate having a second bond site, and wherein the conductive link is connected between the first and second bond sites.

11. The package of claim 1, further comprising a foam material disposed between the conductive link and an interior surface of the enclosure.

12. The package of claim 1 wherein the enclosure includes a contact structure having electrical contacts for coupling the microelectronic package to other components, the enclosure further including walls between the contact structure and the microelectronic substrate, and wherein the contact structure has a sealed aperture initially open to allow gas to enter the enclosure and then closed to at least restrict the gas from exiting the enclosure.

13. The package of claim 1 further comprising a gas within the enclosure and wherein the gas includes a reducing agent.

14. The package of claim 1 wherein the enclosure includes an electrically insulative material sealed about the microelectronic substrate.

15. The package of claim 1 wherein the microelectronic device feature is a first microelectronic device feature and the microelectronic substrate has a second microelectronic device feature with the conductive link connected between the first and second microelectronic device features and suspended between two points positioned between the first and second microelectronic device features.

16. The package of claim 1 wherein the enclosure includes an electrically conductive material.

17. The package of claim 1 wherein the enclosure includes at least one of copper, a copper alloy, aluminum and an aluminum alloy.

18. The package of claim 1 wherein the enclosure includes at least one of silicon dioxide and silicon nitride.

19. The package of claim 1 wherein the enclosure includes the same conductive material as is included in the conductive link.

20. The package of claim 1 wherein the microelectronic substrate is supported by and electrically coupled to a support substrate, and wherein the enclosure is sealably connected to the support substrate.

21. A microelectronic device package, comprising:
a microelectronic substrate having at least one microelectronic device feature;
a first bond site electrically coupled to the at least one microelectronic device feature;
a support substrate engaged with the microelectronic substrate, the support substrate having a second bond site;
a conductive link connected between the first and second bond sites; and
an enclosure sealably disposed around the microelectronic substrate and the conductive link, the enclosure being configured to contain a gas in contact with the conductive link at a pressure at least one atmosphere greater than a pressure external to the enclosure.

22. The package of claim 21, wherein the enclosure is configured to contain a gas at a pressure of from about 5 atmospheres above the external pressure to a pressure of about 50 atmospheres above the external pressure.

23. The package of claim 21, further comprising a gas within the enclosure.

24. The package of claim 21 wherein the conductive link includes a wire bond.

25. The package of claim 21 wherein the conductive link includes a solder ball.

26. The package of claim 21 wherein the enclosure is sealably attached to the support substrate.

27. The package of claim 21 wherein the conductive link is a first conductive link and the microelectronic device feature is a first microelectronic device feature, and wherein the package further comprises a second conductive link coupled between the first and second microelectronic device features.

28. The package of claim 21, wherein the conductive link is a first conductive link and the microelectronic device feature is a first microelectronic device feature, and wherein the package further comprises a second conductive link coupled between the first and second microelectronic device features, with at least a portion of the second conductive link between the first and second microelectronic device features being suspended between a first point and a second point.

29. The package of claim 21 wherein the enclosure includes a metallic material.

30. The package of claim 21 wherein the enclosure is a first enclosure and wherein the package further comprises a second enclosure disposed within the first enclosure and adjacent to the microelectronic substrate.

31. The package of claim 21 wherein the enclosure is a first enclosure, the conductive link is a first conductive link, and the at least one microelectronic device feature includes a first microelectronic device feature, and wherein the microelectronic substrate has a second microelectronic device feature, and further wherein the package further comprises:
a second conductive link coupled between the first and second microelectronic device features; and
a second enclosure disposed within the first enclosure and adjacent to the microelectronic substrate, the second enclosure having the first bond site and having an aperture positioned to allow fluid communication between an interior region of the first enclosure and an interior region of the second enclosure with the interior regions of the first and second enclosures at approximately the same pressure.

32. A microelectronic package manufactured by a process that comprises:
forming at least one microelectronic device feature at least proximate to a surface of a microelectronic substrate;
coupling a conductive link to the at least one microelectronic device feature of the microelectronic substrate;
disposing an enclosure around at least a portion of the microelectronic substrate;
sealing a gas within the enclosure and in contact with the conductive link with the gas at a pressure at least one atmosphere above atmospheric pressure; and
exposing the enclosure to atmospheric pressure while the gas remains sealed within the enclosure.

33. The package of claim 32 wherein the process further comprises:
placing the microelectronic substrate, the enclosure, and the conductive link in an elevated pressure environment having a pressure at least one atmosphere greater than atmospheric pressure while the enclosure remains open to the elevated pressure environment;
sealing the enclosure while the enclosure remains in the elevated pressure environment; and
removing the enclosure, the microelectronic substrate and the conductive link as a unit from the elevated pressure environment.

34. The package of claim 32 wherein the enclosure includes an aperture and wherein sealing the gas within the enclosure includes disposing solder on a metallic ring disposed around an aperture in the enclosure, disposing a metallic lid on the solder, and elevating a temperature of the enclosure to bond the metallic lid to the metallic ring.

35. The package of claim 32, wherein the process further comprises selecting the gas disposed within the enclosure to include at least one of hydrogen and helium.

36. The package of claim 32 wherein exposing the enclosure to a pressure includes exposing the enclosure to a pressure of from about 5 atmospheres to about 50 atmospheres below a pressure within the enclosure.

37. The package of claim 32 wherein the at least one microelectronic device feature includes a first microelectronic device feature and a second microelectronic device feature, and wherein the method further comprises suspending at least a portion of the conductive link between two points positioned between the first and second microelectronic device features.

38. The package of claim 32, further comprising selecting the enclosure to include an electrically conductive material.

39. The package of claim 32, further comprising selecting the enclosure to include the same conductive material as is included in the conductive link.

40. The package of claim 32, further comprising forming at least a portion of the enclosure simultaneously with forming the conductive link.

* * * * *